(12) United States Patent
Luc (10) Patent No.: US 10,910,989 B2
(45) Date of Patent: Feb. 2, 2021

(54) METHODS FOR FORMING SOLAR PANELS (71) Applicant: The Boeing Company, Chicago, IL (US)

(72) Inventor: Phil Luc, Alhambra, CA (US)

(73) Assignee: THE BOEING COMPANY, Chicago, IL (US)

( * ) Notice: Subject to any disclaimer, the term of this patent is extended or adjusted under 35 U.S.C. 154(b) by 187 days.

(21) Appl. No.: 15/907,943

(22) Filed: Feb. 28, 2018

(65) Prior Publication Data
US 2019/0267934 A1 Aug. 29, 2019

(51) Int. Cl.
*H02S 30/00* (2014.01)
*F24S 25/67* (2018.01)
(Continued)

(52) U.S. Cl.
CPC ............... *H02S 30/00* (2013.01); *F24S 25/63* (2018.05); *F24S 25/67* (2018.05); *H01L 31/048* (2013.01);
(Continued)

(58) Field of Classification Search
CPC ......... Y02E 10/40; Y02E 10/47; Y02E 10/50; H02S 20/00; H02S 20/10; H02S 20/20; H02S 20/22; H02S 20/23; H02S 20/30; H02S 20/32; H02S 30/00; H02S 30/10; F24S 25/60; F24S 2025/601; Y02B 10/10;
(Continued)

(56) References Cited

U.S. PATENT DOCUMENTS 6,462,265 B1 * 10/2002 Sasaoka ............... H01L 31/048
136/251
9,577,129 B1 * 2/2017 Richards ............. H01L 31/0504
(Continued)

FOREIGN PATENT DOCUMENTS

JP 2001081915 A * 3/2001
JP 2001223382 A * 8/2001
(Continued)

OTHER PUBLICATIONS

"3M High Temperature Acrylic Adhesive 100, 941, 965, 966, 9461P, 9461C, 9462P," Technical Data Sheet, Jun. 2014, 8 pages.
(Continued)

*Primary Examiner* — Philip C Tucker
*Assistant Examiner* — Brian R Slawski
(74) *Attorney, Agent, or Firm* — MH2 Technology Law Group LLP (57) ABSTRACT

A method for forming a solar panel can include attaching one or more tacking pads to one or both of a first surface of a first solar panel subassembly and a second surface of a second solar panel subassembly. The method further includes dispensing an adhesive onto at least one of the first and second surfaces. The first and second surfaces are placed in contact with the one or more tacking pads, thereby tacking the first and second solar panel subassemblies together, during which the first and second surfaces contact the adhesive, thereby decreasing a thickness and increasing a surface area of the adhesive. Subsequently, the adhesive is cured. The tacking pad(s) maintain fixed alignment of the solar panel subassemblies during curing of the adhesive, and establish a bond line of the adhesive.

19 Claims, 4 Drawing Sheets

(51) Int. Cl.

| | |
|---|---|
| *H01L 31/048* | (2014.01) |
| *F24S 25/63* | (2018.01) |
| *F24S 25/60* | (2018.01) |
| *B29C 65/48* | (2006.01) |
| *B32B 37/12* | (2006.01) |
| *B32B 7/14* | (2006.01) |
| *H02S 20/00* | (2014.01) |
| *B29C 65/50* | (2006.01) |
| *B29C 65/72* | (2006.01) |

(52) U.S. Cl.
CPC ........ *B29C 65/484* (2013.01); *B29C 65/4825* (2013.01); *B29C 65/5021* (2013.01); *B29C 65/5057* (2013.01); *B29C 65/72* (2013.01); *B32B 7/14* (2013.01); *B32B 37/1292* (2013.01); *B32B 2037/1261* (2013.01); *F24S 2025/601* (2018.05); *H02S 20/00* (2013.01); *Y02E 10/47* (2013.01)

(58) Field of Classification Search
CPC ... Y02B 10/12; B32B 7/14; B32B 2037/1246; B32B 2037/1253; B32B 2037/1261; B32B 37/1284; B32B 37/1292; B29C 65/00; B29C 65/48; B29C 65/4825; B29C 65/483; B29C 65/484; B29C 65/50; B29C 65/5007; B29C 65/5021; B29C 65/5057; B29C 65/72; B29C 66/00; B29C 66/21; B29C 66/40; B29C 66/41; B29C 66/43; B29C 66/45; B29C 66/47; B29C 66/472; B29C 66/4722
USPC ....... 156/60, 71, 91, 92, 182, 281, 290, 291, 156/295, 297, 299, 300, 306.6, 306.9, 156/313, 325, 326, 327, 329, 332; 136/244, 246, 251, 252, 259; 52/173.3; 257/E27.123, E27.124; 438/64, 66, 67; 29/890.033

See application file for complete search history.

(56) References Cited

U.S. PATENT DOCUMENTS

| | | | | |
|---|---|---|---|---|
| 2005/0274410 | A1* | 12/2005 | Yuuki | B32B 17/10091 136/251 |
| 2011/0032618 | A1* | 2/2011 | Handerek | B32B 37/12 359/576 |
| 2012/0132279 | A1* | 5/2012 | Namiki | H01L 31/048 136/259 |
| 2012/0240972 | A1* | 9/2012 | Hitomi | H02S 20/22 136/244 |
| 2013/0098447 | A1* | 4/2013 | Obinata | H01L 31/0203 136/259 |
| 2013/0146122 | A1* | 6/2013 | Chung | H01L 31/1876 136/246 |
| 2016/0268463 | A1* | 9/2016 | Richards | H01L 31/048 |

FOREIGN PATENT DOCUMENTS

| | | | | |
|---|---|---|---|---|
| JP | 2003110127 | A | * | 4/2003 |
| JP | 2008053419 | A | * | 3/2008 |
| JP | 2008270648 | A | * | 11/2008 |
| JP | 2013222722 | A | * | 10/2013 |
| WO | WO-8804832 | A1 | * | 6/1988 ........... H01L 31/048 |
| WO | WO-2011109701 | A2 | * | 9/2011 |

OTHER PUBLICATIONS

NuSil, "CV1-2289-1 Controlled Volatility Potting and Encapsulating Silicone Elastomer," Advanced Engineering, May 21, 2014, Rev. A, 4 pages.

* cited by examiner

METHODS FOR FORMING SOLAR PANELS

TECHNICAL FIELD

The present teachings relate to the field of solar panels and, more particularly, to solar panel construction and structure.

BACKGROUND

Solar panels typically include a first subassembly including a printed circuit in the form of a printed circuit board (PCB), a flexible printed circuit (flex circuit), or a rigid surface (referred to herein as a substrate), and a second subassembly including an individual solar cell or an array of solar cells formed as a separate assembly (referred to herein as a circuit). During construction of the solar panel, the substrate and the circuit are attached together using a paste adhesive. Once the adhesive is dispensed onto one or both of the subassemblies, the substrate and circuit are closely positioned in contact with the adhesive. The subassemblies are then aligned and secured, typically with fixture during curing of the adhesive, which may require 24 hours to seven days. Continuous external compressive pressure using, for example, a vacuum is applied. The external pressure is sufficient to set the thickness or bond line of the adhesive so that the spacing between the subassemblies and the thickness of the adhesive is within a design tolerance. Additionally, the adhesive may include glass fillers having a diameter approximately equal to the designed adhesive bond line so that the thickness of the adhesive and the spacing between the subassemblies is correct in the final solar panel assembly. Prior to achieving full cure of the adhesive, excess adhesive that flows from between the circuit and the substrate is removed. The external compressive pressure may be removed once handling cure is achieved, and additional assembly may be subsequently performed.

A simplified method for forming a solar panel, and the solar panel resulting from the simplified method, would be a welcome addition to the art.

SUMMARY

The following presents a simplified summary in order to provide a basic understanding of some aspects of one or more implementations of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an implementation of the present teachings, a method for forming a solar panel includes adhering at least one tacking pad to a first surface of a first solar panel subassembly, dispensing an adhesive onto one of the first surface, a second surface of a second solar panel subassembly, or both and placing the second surface in physical contact with the at least one tacking pad after the adhering of the at least one tacking pad and after the dispensing of the adhesive, thereby tacking the first and second solar panel subassemblies together. The method further includes physically contacting the adhesive with the first and second surfaces during the placing wherein, during the placing, a thickness of the adhesive decreases and a surface area of the adhesive increases, and curing the adhesive after the tacking of the first and second solar panel subassemblies together. Optionally, the adhering of the at least one tacking pad to the first surface can further include adhering a plurality of tacking pads to the first surface. The dispensing of the adhesive can include dispensing a plurality of physically spaced adhesive dots across the one of the first surface, the second surface, or both the first surface and the second surface.

The at least one tacking pad can be a pressure-sensitive tacking pad, and can include a polymer carrier positioned between two layers of an acrylic adhesive. The adhesive can include a silicone elastomer that has a working time of from 30 minutes to 4 hours, and can extend across from 40% to 90% of the first surface after the placing of the second surface in physical contact with the at least one tacking pad.

In an implementation, at least one of the first and second solar panel subassemblies can include an array of solar cells, and the other of the first and second solar panel subassemblies can include a printed circuit. The method can further optionally include selecting the tacking pad to have a thickness based on a bond line of the adhesive of the solar panel.

In another implementation, a solar panel includes a first solar panel subassembly having an array of solar cells, a second solar panel subassembly including a printed circuit, at least one tacking pad positioned between the first solar panel subassembly and the second solar panel subassembly, and adhered to a first surface of the first solar panel subassembly and a second surface of the second solar panel subassembly with a first adhesive force, and an adhesive layer positioned between the first solar panel subassembly and the second solar panel subassembly, and adhered to the first surface of the first solar panel subassembly and the second surface of the second solar panel subassembly with a second adhesive force that is greater than the first adhesive force.

The at least one tacking pad can optionally include a plurality of tacking pads, wherein each tacking pad includes a width of from about 0.1 inches to about 1.0 inch, or from about 0.1 to about 0.5 inches. The adhesive layer can include a plurality of physically spaced adhesive dots. The at least one tacking pad can be a pressure-sensitive tacking pad, and can include a polymer carrier and an acrylic adhesive. The adhesive of the solar panel can be or include a silicone elastomer.

In an implementation, the at least one tacking pad can be attached to the first and second surfaces with an adhesion force of from 25 ounces per square inch ($oz/in^2$) to 45 $oz/in^2$. The adhesive can extends across, and physically contact, from 40% to 90% of an area of the first surface. A thickness of the at least one tacking pad can be within ±5% of a bond line of the adhesive.

In another implementation, an electronic device includes a plurality of solar panels, wherein each solar panel includes a first solar panel subassembly having an array of solar cells, a second solar panel subassembly having a printed circuit, at least one tacking pad positioned between the first solar panel subassembly and the second solar panel subassembly, and adhered to a first surface of the first solar panel subassembly and a second surface of the second solar panel subassembly with a first adhesive force, and an adhesive layer positioned between the first solar panel subassembly and the second solar panel subassembly, and adhered to the first surface of the first solar panel subassembly and the second surface of the second solar panel subassembly with a second adhesive force that is greater than the first adhesive force. The electronic device can further include at least one battery electrically coupled to the solar panels.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures:

FIG. 1A is a perspective view depicting a first solar panel subassembly.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary implementations of the present teachings, examples of which are illustrated in the accompanying drawings. Wherever convenient, the same reference numbers will be used throughout the drawings to refer to the same or like parts.

As discussed above, solar panel subassemblies including a substrate and a circuit are attached together using an adhesive during formation of the solar panel. During curing of the adhesive, the solar panel subassemblies are typically placed within a fixture that aligns and maintains the two subassemblies in fixed relative position. The fixture may apply a compressive pressure to the subassemblies to set a bond line of the adhesive, or the curing may be performed in a vacuum environment. Curing of the adhesive may require from one to seven days.

While currently recognized as the state of the art for solar panel manufacture, the use of a fixture to position the subassemblies during curing of the adhesive has various drawbacks. For example, designing and manufacturing fixtures, or purchasing the fixtures from a supplier, increases solar panel manufacturing costs. Additionally, fixtures are typically customized for the particular design of the solar panel and thus require replacement or retooling for a solar panel design change. Furthermore, the fixtures must be stored and maintained, and attaching the fixtures to the solar panel subassemblies and their subsequent removal adds labor costs. Cleaning up of adhesive squeeze-out between the circuits/cells is also time consuming and exposes the circuits/cells to breakage.

An implementation of the present teachings can result in simplified construction of a solar panel that can decrease rework, for example, by using tacking pads to set a consistent adhesive bond line, thereby preventing the need to rework an assembly having an improperly sized adhesive bond line. Implementations of the construction method described herein decrease the amount of tooling required, for example, tooling that conventionally maintains subassemblies in fixed relative alignment during an adhesive cure, and further eliminates the labor associated with placing and removing such tooling. By reducing rework, tooling, and labor, manufacturing costs can be decreased compared to conventional methods of solar panel construction.

In further contrast to conventional solar panel construction methods, an implementation of the present teachings does not require a compressive pressure to be applied to hold the first solar panel assembly and the second solar panel subassembly together during a partial cure or complete cure of the adhesive. In conventional methods, one or more of a fixture, a vacuum, or another compression source is applied to the solar panel subassemblies to maintain them in fixed alignment during the cure of an adhesive. In this respect, because a compressive pressure need not be applied to the solar panel subassemblies to hold them in fixed alignment while the adhesive is curing, an implementation of the present method is referred to herein as "pressureless," though some implementations may include the use of an applied pressure. In an implementation, one or more tacking pads maintain the solar panel subassemblies in fixed alignment to each other during an adhesive curing processing stage.

Figure 1A:
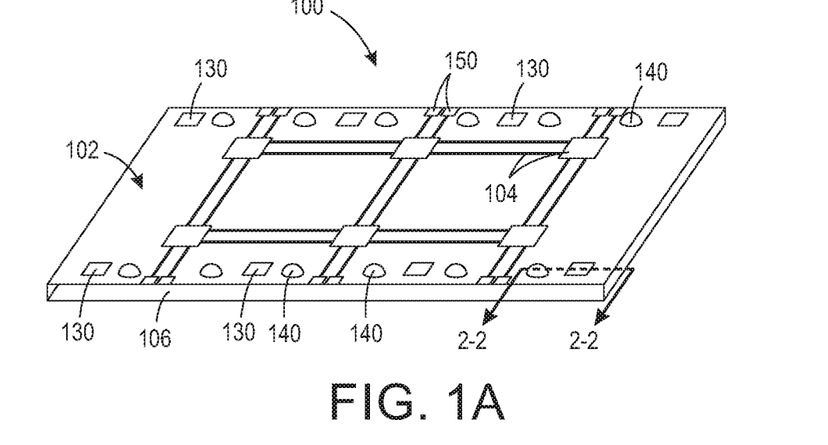

FIGS. 1A-4 depict in-process structures during formation of a solar panel according to an implementation of the present teachings. FIG. 1A is a perspective view depicting a first solar panel subassembly 100 having a first surface 102, where the first solar panel subassembly 100 includes solar panel circuitry 104 formed on and/or within a first substrate 106. The first substrate 106 can be, for example, a printed circuit board, a flexible printed circuit (i.e., flex circuit), a rigid substrate, etc. FIG. 1B depicts a second solar panel subassembly 110 having a second surface 112, where the second solar panel subassembly 110 includes one or more solar cell arrays 114 each including a plurality of solar cells (not individually depicted for simplicity) formed on a second substrate 116. The second substrate 116 can be, for example, one or more glass panels including patterned metallization that forms the solar cell array 114. The first 100 and second 110 solar panel subassemblies can be formed in accordance with known techniques.

Figure 1B:
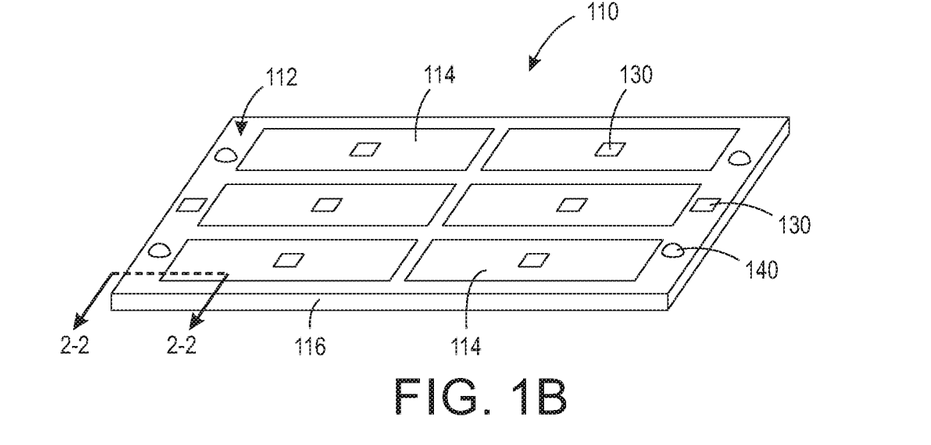
FIG. 1B is a perspective view depicting a second solar panel subassembly, in accordance with an implementation of the present teachings.

FIGS. 1A and 1B further depict at least one tacking pad 130, for example a plurality of tacking pads 130, attached to one of the first surface 102, the second surface 112, or both the first surface 102 and second surface 112. Additionally, FIGS. 1A and 1B depict an adhesive 140 dispensed onto one of the first surface 102, the second surface 112, or both the first surface 102 and second surface 112. For purposes of explanation, FIGS. 1A and 1B depict tracking pads 130 attached to, and adhesive 140 dispensed onto, both the first surface 102 and the second surface 112.

The tacking pads 130 may be placed manually by an operator or technician, using automated equipment such as automated pick-and-place equipment, or using another suitable placement technique. Similarly, the adhesive 140 may be dispensed manually or using automated equipment such as an automated adhesive dispense system.

The tacking pads 130 can be placed across surfaces 102 and/or 112 at locations that do not adversely affect the construction or operation of the completed device. For example, electrically conductive contact pads 150 to which electrical contact will be made during operation of the completed solar panel can be avoided, as placement of either the tacking pads 130 or adhesive 140 may hinder or prevent subsequent electrical connection to the electrically conductive contact pads 150.

The tacking pads 130 can be formed to have any desired shape, for example, round, square, rectangular, etc., and any desired size, for example, from 0.1 inches to about 0.5 inches, depending on solar cell size. Tacking pads 130 that are excessively large and/or have an unsuitable shape would not lend themselves to straightforward placement in regions that do not interfere with the operation of the completed solar panel. Tacking pads 130 that are too small would require placement of a large number of tacking pads 130 to maintain proper stable alignment of the solar panel subassemblies 100, 110 during the cure of the adhesive 140. In an implementation, the tacking pads 130 can be formed over from about 1% to about 5% of the first and second surfaces 102, 112 in the completed solar panel. Applying the tacking pads 130 to too small of an area would not securely maintain the solar panel subassemblies 100, 110 in fixed relative position during a cure of the adhesive 140, and thus the solar panel subassemblies 100, 110 can become misaligned. Applying the tacking pads 130 to too large of an area would decrease an adhesive strength of the solar panel assemblies 100, 110 subsequent to curing of the adhesive 140, and may therefore result in failure of the completed solar panel.

Similarly, the adhesive 140 can be placed at locations across surfaces 102 and/or 112 at locations that do not adversely affect the construction or operation of the completed device, for example, avoiding the electrically conductive contact pads 150, as well as the regions where the tacking pads are placed so as to avoid interfering with the adhesive properties of the tacking pads 130. In an implementation, the adhesive 140 can be applied as a plurality of adhesive dots as depicted in FIGS. 1A and 1B, where each adhesive dot is targeted for a specific volume or weight of adhesive 140. In one implementation, each adhesive dot can have a weight of from about 0.01 grams to about 0.5 grams, or from about 0.01 grams to about 0.1 grams. A number of adhesive dots are applied to sufficiently adhere the first and second solar panel subassemblies 100, 110 together after curing the adhesive 140 to avoid separation of the completed solar panel under anticipated operating conditions. Applying an excessive amount of adhesive 140 can result in an excess of adhesive flowing from between the first and second solar panel subassemblies 100, 110, thereby requiring excessive cleanup, and the possibility of adhesive 140 flowing over undesired solar panel locations. An insufficient amount of adhesive 140 can result in inadequate adhesion, and possible separation and failure of the completed solar panel. In an implementation, the adhesive 140 can be formed over from about 40% to about 90% of the first and second surfaces 102, 112 in the completed solar panel.

Figure 2:
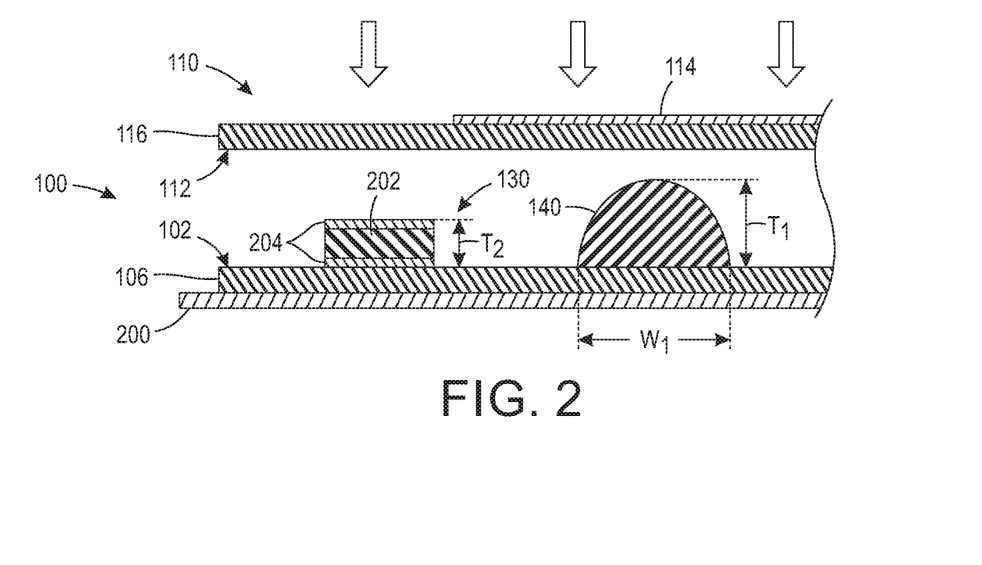
FIG. 2 is a magnified cross section along 2-2 of FIGS. 1A and 1B after positioning the first and second solar panel subassemblies in proximity to each other.

FIG. 2 is a magnified cross section along 2-2 of FIGS. 1A and 1B after placing the second surface 112 in proximity to the first surface 102 during the assembly process. In this implementation, the first solar panel subassembly 100 may be placed onto a work surface 200 during assembly.

As depicted in FIG. 2, the tacking pads 130 can be pressure-sensitive tacking pads 130 that include a carrier (i.e., carrier layer) 202 positioned between two adhesive layers 204, where the adhesive layers 204 self-adhere to the carrier 202. The carrier 202 can be, for example, a polymer such as a polyimide or a thermosetting plastic that has adequate surface adhesion strength. The adhesive layers 204 can be dry and tacky adhesive layers of a material such as an acrylic adhesive. Commercially available materials suitable for use as the tacking pads 130 include 3M™ High Temperature Acrylic Adhesive 100, for example, Adhesive Transfer Tape 966 that has been cut to a desired size and shape.

The adhesive 140 can be an adhesive that is suitable for the anticipated operating conditions of the completed solar panel during use. In an aerospace implementation, for example, the adhesive 140 can be a space grade, low outgas, platinum cure adhesive that maintains sufficient adhesion across a wide range of operating temperatures, for example, in the environment and extreme temperature ranges of space. In one implementation, the adhesive 140 after curing can maintain sufficient adhesive properties across a temperature ranging from −175° C. to +155° C. The adhesive 140 can be or include a heat-curable adhesive to decrease solar panel manufacture time, for example, a silicone elastomer. Commercially available materials suitable for use as the adhesive 140 includes CV1-2289-1 silicone elastomer available from NuSil Technology LLC. The adhesive 140 has a working time sufficient to allow assembly of the first and second solar panel subassemblies 100, 110, for example, from 30 minutes to 4 hours.

FIG. 2 further depicts an initial variable thickness "$T_1$" of adhesive 140 relative to a fixed thickness "$T_2$" of the tacking pads 130 after dispensing the adhesive 140 and before solar panel assembly. In this implementation, at the processing stage of FIG. 2, $T_1 > T_2$. As depicted in FIG. 2, the adhesive 140 has a first surface area subsequent to dispensing the adhesive 140. FIG. 2 further depicts adhesive 140 having an initial width of "$W_1$" across, and physically contacting, the surface onto which it is dispensed which, in FIG. 2, is the first surface 102 of the first solar panel subassembly 100.

Figure 3:
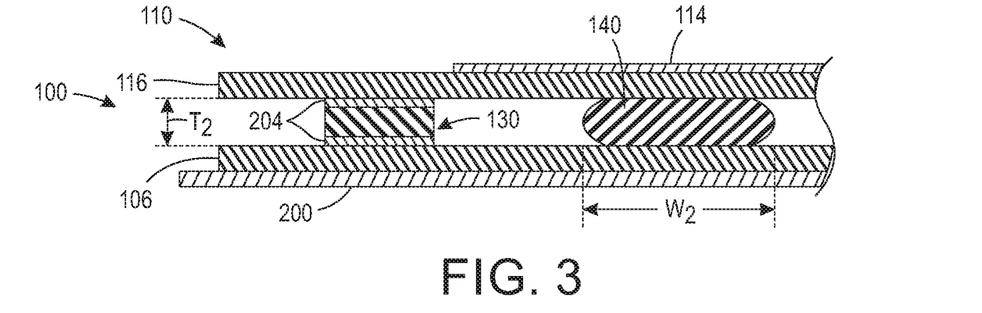
FIG. 3 depicts the FIG. 2 structure after physically contacting a first surface of the first solar panel subassembly and a second surface of the second solar panel subassembly to a plurality of tacking pads and an adhesive.

Between FIGS. 2 and 3, the second surface 112 is placed in physical contact with the tacking pads 130 after the adhering of the tacking pad 130 to at least one of the first surface 102 and the second surface 112, and after the dispensing of the adhesive 140 to at least one of the first surface 102 and the second surface 112. A sufficient compressive force is applied between the first and second solar panel subassemblies 100, 110 to thin the adhesive 140 and to contact both the first and second surfaces 102, 112 with the adhesive 140 and the adhesive layers 204 of the tacking pads 130. As depicted in FIG. 3, the first surface 102 and the second surface 112 are tacked together using the tacking pads 130, thereby tacking the first solar panel subassembly 100 and the second solar panel subassembly 110 together. As depicted in FIGS. 2 and 3, during the physical contacting of the second surface 112 with the adhesive 140, the thickness of the adhesive 140 decreases from $T_1$ in FIG. 2 to $T_2$ in FIG. 3, and a width of the adhesive 140 increases from $W_1$ in FIG. 2 to $W_2$ in FIG. 3, thereby also increasing the surface area of the adhesive 140. The thickness $T_2$ of the tacking pad 130 thereby determines a bond line of the adhesive 140 in FIG. 3, which is equal to $T_2$.

Figure 4:
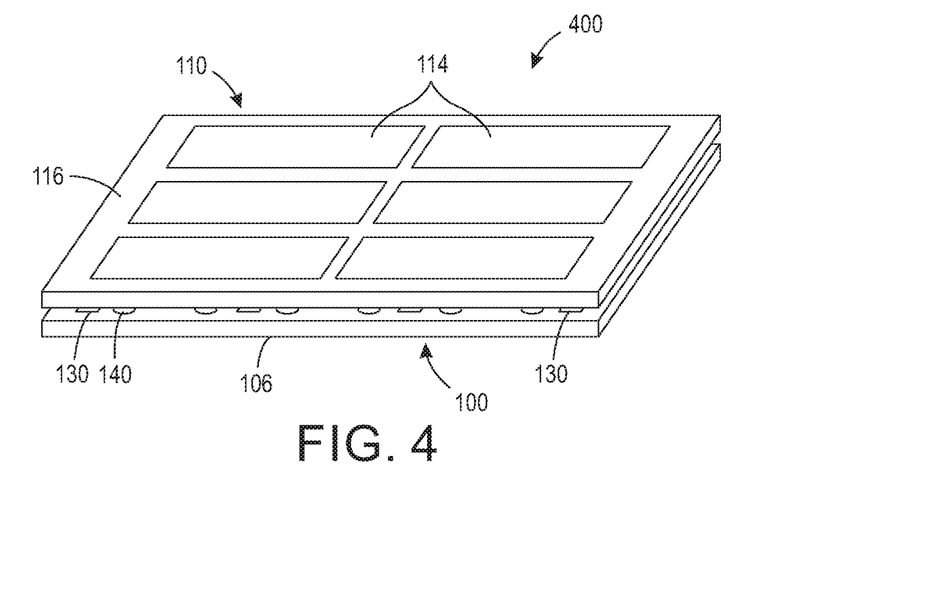
FIG. 4 is a perspective depiction of a completed solar panel.

After tacking the first solar panel subassembly 100 and the second solar panel subassembly 110 together as depicted in FIG. 3, the adhesive 140 is cured using a process suitable to the adhesive 140 and the other components of the solar panel sufficient process to result in a completed solar panel 400 as depicted in FIG. 4. The method of curing can include maintaining the adhesive 140 at room temperature for a period of time, for example, 7 days. In another implementation, the method of curing can include heating the adhesive 140 to a temperature of from about 65° C. to about 150° C., for example about 65° C., for a duration of from about 15 minutes to about 4 hours, for example about 4 hours. As current solar panel processing techniques require a minimum adhesive cure time of 7 days, this improvement in curing time compared to conventional solar panel formation decreases product processing time, increases manufacturing output, and thereby decreases costs.

Figure 5:
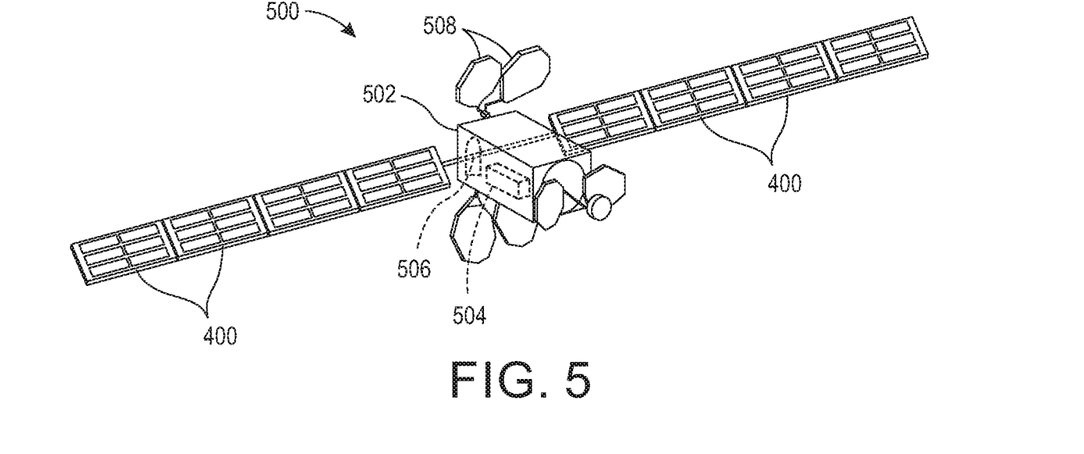
FIG. 5 depicts an implementation of the present teachings including a plurality of solar panels.

After forming the solar panel 400, one or more solar panels 400 can be utilized as an electronic device subcomponent to generate solar power for an electronic device. FIG. 5 depicts a plurality of solar panels 400 that are used in the conversion of solar energy to electrical energy, where the plurality of solar panels 400 are assembled with other components to form an electronic device 500, representationally depicted as a satellite. In this particular representational implementation, the other components can include a housing 502 that encases and protects, for example, one or more batteries 504 electrically coupled to the plurality of solar panels 400, fuel tanks 506, etc. The other components can also include one or more antennas 508. Use of one or more solar panels 400 with an electronic device 500 other than a satellite is contemplated, for example, other aerospace equipment and transportation vehicles, military and commercial vehicles and equipment, raw electrical power generation such as solar farms, etc.

Figure 6:
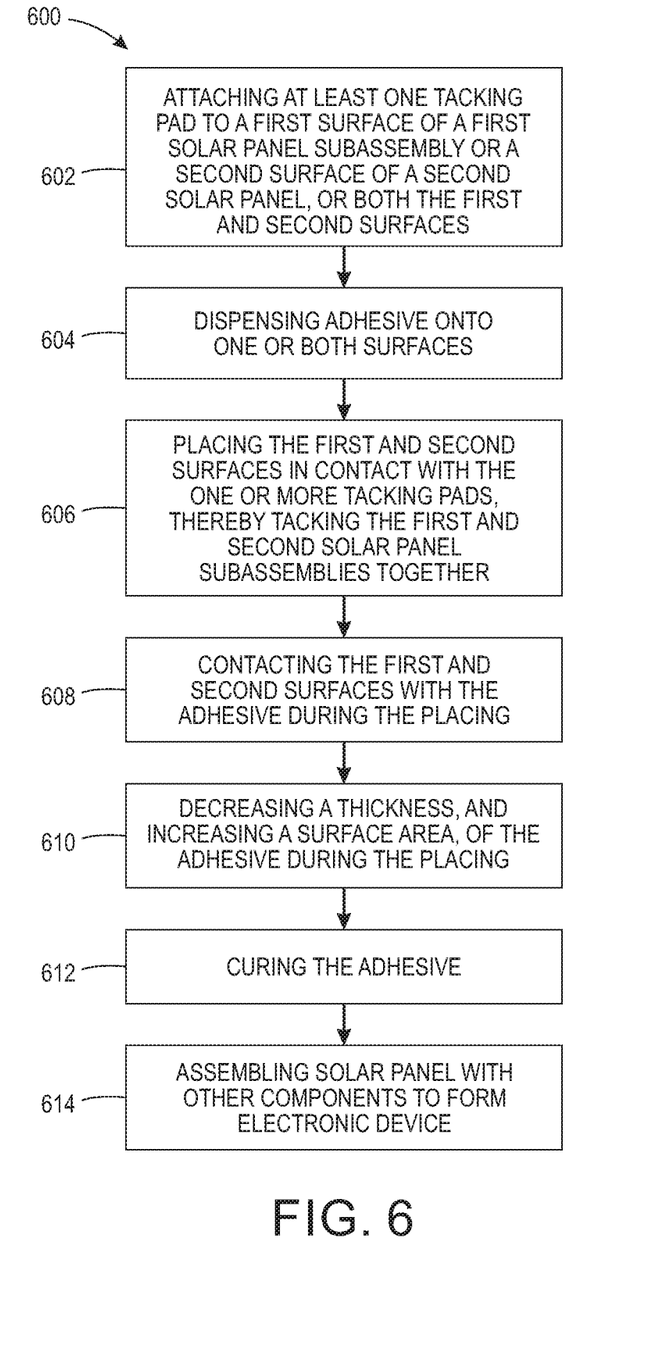
FIG. 6 is a flow chart depicting an implementation of a method for forming a solar panel and an electronic device in accordance with the present teachings.

A process or method 600 for forming a solar panel is depicted in the flow chart of FIG. 6. The method 600 can proceed by operation or use of one or more of the structures depicted in the figures described above, and thus is described with reference to FIGS. 1A-5; however, it will be appreciated that the method 600 is not limited to any particular structure or use unless expressly stated herein. It will be appreciated that while the method 600 is described as a series of acts or events, the present teachings are not limited by the ordering of such acts or events. Some acts can occur in different orders and/or concurrently with other acts or events apart from those described herein. Further, a method in accordance with the present teachings can include other acts or events that have not been depicted for simplicity, while other illustrated acts or events can be removed or modified.

As depicted at 602, the method 600 can include attaching at least one tacking pad 130 to a first surface 102 of a first solar panel subassembly 100 or to a second surface 112 of a second solar panel subassembly 110, or to both the first and second surfaces 102, 112. Adhesive 140 is dispensed onto one or both of the first and second surfaces 102, 112 as at 604. Subsequently, as depicted at 606, the first and second surfaces 102, 112 are placed in contact with the one or more tacking pads 130, thereby tacking the first solar panel subassembly 100 and the second solar panel subassembly 110 together. During the placing of the first and second surfaces 102, 112 in contact with the tacking pads 130, the first and second surfaces 102, 112 contact the adhesive 140 as at 608, which decreases a thickness, and increases a surface area, of the adhesive 140 as at 610. Next, the adhesive 140 is cured to form a solar panel 400 as depicted at 612. At 614, one or more solar panels 400 can be assembled with other components to form an electronic device 500.

Thus an implementation of the present teachings provides a simplified method for forming a solar panel compared to conventional methods, and a solar panel formed using the method. The solar panel includes one or more tacking pads that provide a secondary adhesive that maintains the first solar panel assembly and the second solar panel subassembly in fixed alignment during the curing of a primary adhesive. While the tacking pads remain a part of the completed solar panel, the primary adhesive provides the majority of adhesion of the first and second solar panel subassemblies in the completed solar panel. That is, the first and second surfaces are adhered together in the completed solar panel by the tacking pads with a first adhesive force, and are adhered together by the adhesive with a second adhesive force, where the second adhesive force is greater than the first adhesive force. In some implementations of a completed solar panel, the primary adhesive can contribute 95% or more (but generally less than 100%) of the adhesive force between the first and second solar panel subassemblies, while the tacking pads provide 5% or less (but generally, more than 0%) of the adhesive force. In an implementation, the adhesive forces may be defined as adhesion forces, where the adhesion force of the tacking pad or plurality of tacking pads is from about 25 ounces per square inch (oz/in$^2$) to about 45 oz/in$^2$. The first and second adhesive forces can be measured, for example, using destructive and/or non-destructive testing. The adhesive forces can be measured and compared using a first test sample including first and second solar panel subassemblies 100, 110 adhered with only a number of tacking pads 130, and a second test sample including first and second solar panels 100, 110 adhered with only an amount of adhesive 140. The number of tacking pads 130 and the amount of adhesive 140 in the test samples can be analogous to those used in the completed solar panel 400 design. In one exemplary measurement technique, a tensile force can be applied to each of the test samples using conventional tensile strength testing equipment. The tensile forces can be measured, for example, in newtons per square meter (N/m$^2$ or pascals), kilograms per square centimeter (Kg/cm$^2$), pounds per square inch (PSI), ounces per square inch (oz/in$^2$), etc.

Additionally, the adhesive and the tacking pads are dielectric materials that do not contribute electrically to the operation of the completed solar panel. Moreover, a thickness of the tacking pads determines or establishes a bond line of the adhesive between the first and second solar panel subassemblies. In an implementation, a thickness of each tacking pad can be precisely defined, for example, by in-house manufacture, or by working with supplier, to provide a desired and controlled bond line of the completed solar panel.

The use of one or more tacking pads to tack solar panel subassemblies together eliminates the need for including glass beads or microballoon additives in the adhesive for spacing, for example, to set a bond line, which contributes to reducing weight and the need for using adhesives that are compatible with the additives. This also reduces and/or eliminates the need to mix the components, thereby reducing manual mixing, and improves ergonomics. Further, it also eliminates the need to manually remove excess adhesives no squeeze-out). It allows use of less adhesive material, which is important in reducing weight of the final assembly. It also provides the ability to more precisely control adhesive deposition amount and placement/patterning.

As discussed above, because a compressive pressure need not be applied to the solar panel subassemblies to hold them in fixed alignment while the adhesive is curing, an implementation of the present method is referred to herein as "pressureless," though some implementations may include the use of an applied pressure. In an implementation, one or more tacking pads maintain the solar panel subassemblies in fixed alignment to each other during an adhesive curing processing stage.

While the present teachings have been described with reference to solar panels and the adhesion of two solar panel subassemblies together, other uses of the present teachings for attaching a first assembly to a second assembly are contemplated. For example, in one particular use, a mirror reflector (a first assembly) can be bonded to a supporting substrate (a second assembly) using an implementation of the present teachings.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming a solar panel, the method comprising:
    adhering at least one tacking pad to a first surface of a first solar panel subassembly;
    dispensing an adhesive onto one of the first surface, a second surface of a second solar panel subassembly, or both;
    placing the second surface in physical contact with the at least one tacking pad after the adhering of the at least one tacking pad and after the dispensing of the adhesive, thereby tacking the first and second solar panel subassemblies together;
    physically contacting the adhesive with the first and second surfaces during the placing wherein, during the placing, a thickness of the adhesive decreases and a surface area of the adhesive increases; and
    curing the adhesive after the tacking of the first and second solar panel subassemblies together, wherein at least one of the first and second solar panel subassemblies comprises an array of solar cells and the other of the first and second solar panel subassemblies comprises a printed circuit,
    wherein the at least one tacking pad is adhered to the first surface prior to the curing of the adhesive, and
    wherein during the curing of the adhesive, the at least one tacking pad maintains the first and second surfaces in fixed alignment.

2. The method of claim 1, wherein the adhering of the at least one tacking pad to the first surface further comprises adhering a plurality of tacking pads to the first surface.

3. The method of claim 1, wherein the dispensing of the adhesive comprises dispensing a plurality of physically spaced adhesive dots across the one of the first surface, the second surface, or both the first surface and the second surface.

4. The method of claim 1, wherein the at least one tacking pad is a pressure-sensitive tacking pad.

5. The method of claim 1, wherein the at least one tacking pad comprises a polymer carrier positioned between two layers of acrylic adhesive.

6. The method of claim 1, wherein the adhesive comprises silicone elastomer that has a working time of from 30 minutes to 4 hours.

7. The method of claim 1, wherein the adhesive extends across from 40% to 90% of the first surface after the placing of the second surface in physical contact with the at least one tacking pad.

8. The method of claim 1, further comprising selecting the at least one tacking pad to have a thickness based on a bond line of the adhesive of the solar panel.

9. The solar panel of claim 1, wherein a thickness of the at least one tacking pad is within ±5% of a bond line of the adhesive.

10. A method for forming a solar panel, the method comprising:
providing a first solar panel subassembly comprising a printed circuit;
providing a second solar panel subassembly comprising two or more solar cells;
adhering at least one tacking pad to a first surface of the first solar panel subassembly;
dispensing an adhesive onto one of the first surface, a second surface of the second solar panel subassembly, or both;
placing the second surface in physical contact with the at least one tacking pad after the adhering of the at least one tacking pad and after the dispensing of the adhesive, thereby tacking the first and second solar panel subassemblies together;
physically contacting the adhesive with the first and second surfaces during the placing; and
curing the adhesive after the tacking of the first and second solar panel subassemblies together;
wherein the at least one tacking pad is adhered to the first surface prior to the curing of the adhesive, and
wherein during the curing of the adhesive, the at least one tacking pad maintains the first and second surfaces in fixed alignment.

11. The method of claim 10, wherein the two or more solar cells form an array.

12. The method of claim 10, wherein the adhering of the at least one tacking pad to the first surface further comprises adhering a plurality of tacking pads to the first surface.

13. The method of claim 10, wherein the dispensing of the adhesive comprises dispensing a plurality of physically spaced adhesive dots across the one of the first surface, the second surface, or both the first surface and the second surface.

14. The method of claim 10, wherein the at least one tacking pad is a pressure-sensitive tacking pad.

15. A method for forming a solar panel, the method comprising:
providing a first solar panel subassembly comprising two or more solar cells;
providing a second solar panel subassembly comprising a printed circuit;
adhering at least one tacking pad to a first surface of the first solar panel subassembly;
dispensing an adhesive onto one of the first surface, a second surface of the second solar panel subassembly, or both;
placing the second surface in physical contact with the at least one tacking pad after the adhering of the at least one tacking pad and after the dispensing of the adhesive, thereby tacking the first and second solar panel subassemblies together;
physically contacting the adhesive with the first and second surfaces during the placing; and
curing the adhesive after the tacking of the first and second solar panel subassemblies together;
wherein the at least one tacking pad is adhered to the first surface prior to the curing of the adhesive, and
wherein during the curing of the adhesive, the at least one tacking pad maintains the first and second surfaces in fixed alignment.

16. The method of claim 15, wherein the two or more solar cells form an array.

17. The method of claim 15, wherein the adhering of the at least one tacking pad to the first surface further comprises adhering a plurality of tacking pads to the first surface.

18. The method of claim 15, wherein the dispensing of the adhesive comprises dispensing a plurality of physically spaced adhesive dots across the one of the first surface, the second surface, or both the first surface and the second surface.

19. The method of claim 15, wherein the at least one tacking pad is a pressure-sensitive tacking pad.

* * * * *